(12) United States Patent
Brown

(10) Patent No.: US 6,301,176 B1
(45) Date of Patent: Oct. 9, 2001

(54) ASYNCHRONOUS MEMORY SELF TIME SCHEME

(75) Inventor: Jeffrey S. Brown, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/750,214

(22) Filed: Dec. 27, 2000

(51) Int. Cl.[7] ................................................ G11C 7/00

(52) U.S. Cl. .................. 365/203; 365/204; 365/207; 365/190; 365/202

(58) Field of Search .................................. 365/203, 204, 365/207, 190, 202, 198.01, 189.09, 196, 233.5

(56) References Cited

U.S. PATENT DOCUMENTS 6,108,255 * 8/2000 Ciraula et al. ........................ 365/203

* cited by examiner

Primary Examiner—David Nelms
Assistant Examiner—David Lam

(57) ABSTRACT

The circuit generally comprises a bit line, a complementary bit line, a memory cell and a read circuit. The memory cell may be configured to (i) discharge the bit line in response to a memory sense period and (ii) charge the complementary bit line in response to said memory sense period. The read circuit may be configured to (i) precharge the bit line prior to the memory sense period, (ii) discharge the complementary bit line prior to the memory sense period, and (iii) detect when the bit line and the complementary bit line achieve a predetermined voltage separation in response to the memory sense period. The circuit may be used in asynchronous memories.

18 Claims, 3 Drawing Sheets

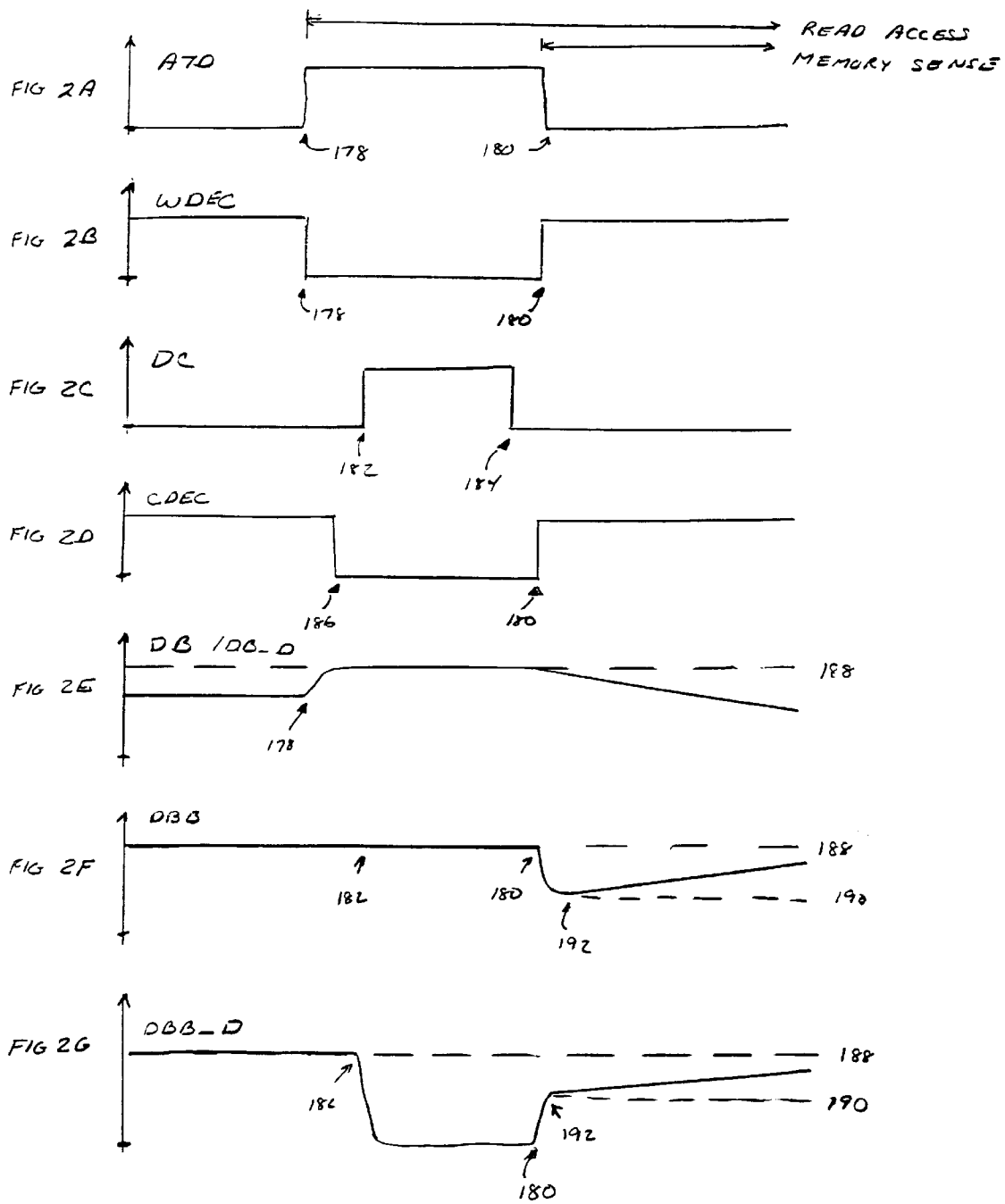

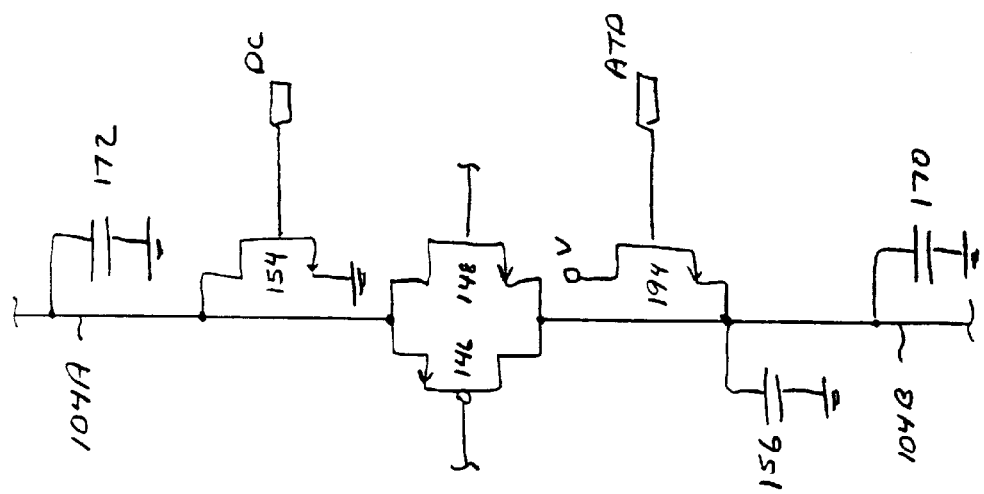
FIG. 5
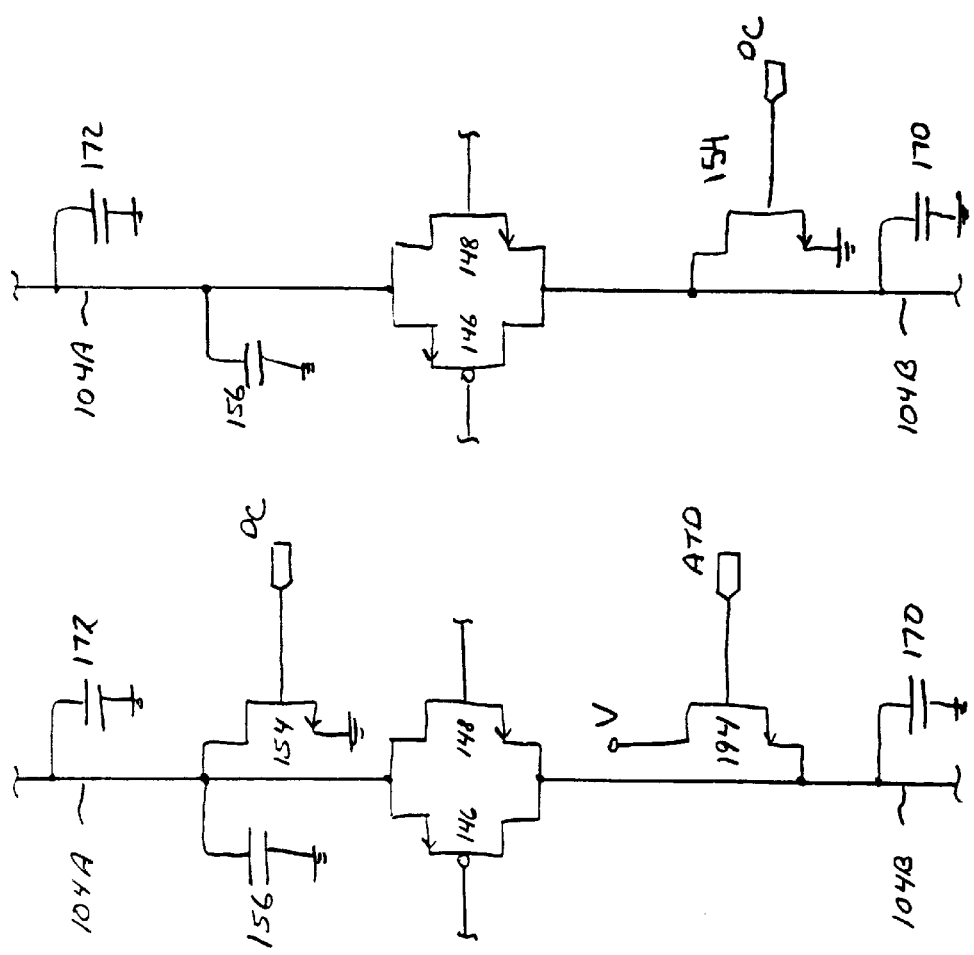
FIG. 4
FIG. 3

US 6,301,176 B1

ASYNCHRONOUS MEMORY SELF TIME SCHEME

FIELD OF THE INVENTION

The present invention relates to asynchronous memory devices generally and, more particularly, to a method and/or architecture for implementing scaled timing associated with a dummy sense amplifier and dummy bit lines that determine when read data is valid.

BACKGROUND OF THE INVENTION

Asynchronous memories use a pair of bit lines to carry data from a bit cell of a selected column and a selected word to a sense amplifier. The bit lines are constantly pulled up by a pair of pullups and are sometimes tied together with an equalization circuit that is always operating. During a memory sense period of a read access operation, the bit cells override the pullups and equalization to cause one bit line to discharge below the other bit line. The sense amplifier presents a data value for the bit cell when the sense amplifier detects a predetermined voltage separation between the two bit lines. The predetermined voltage separation is around 10 percent of the supply voltage. The voltage separation remains on the bit lines until a word line is deasserted. Once the word line is deasserted, then the pullups bias the bit lines back to a precharged voltage.

A set of dummy bit lines, a dummy bit cell having a fixed data value, and a dummy sense amplifier are used to determine when the other sense amplifiers have had sufficient time to present valid data. The fixed data value of the dummy bit cell is selected such that the data presented by the dummy sense amplifier is a sense enable signal for the other sense amplifiers at the end of the read access operation. When the fixed data value is detected by the dummy sense amplifier, then the sense enable signal is deasserted causing data presented by the other sense amplifiers to freeze. Hereafter, the word lines are deasserted and the pullups and equalization circuits equalize all of the bit lines.

A problem with existing asynchronous memory designs is that the timing performed by the dummy bit lines, the dummy bit cell, and the dummy sense amplifier assumes that all other bit lines are starting from a predetermined initial voltage. The memory sense period of a subsequent read access operation cannot be started until the pullups and equalization circuits charge all of the bit lines to the predetermined initial voltage. A secondary precharge network could be used to shorten the time required to equalize the bit lines. Secondary precharge networks, however, require more space and can result in additional power consumption.

SUMMARY OF THE INVENTION

The present invention concerns a circuit that may be used in asynchronous memories. The circuit generally comprises a bit line, a complementary bit line, a memory cell, and a read circuit. The memory cell may be configured to (i) discharge the bit line in response to a memory sense period and (ii) charge the complementary bit line in response to said memory sense period. The read circuit may be configured to (i) precharge the bit line prior to the memory sense period, (ii) discharge the complementary bit line prior to the memory sense period, and (iii) detect when the bit line and the complementary bit line achieve a predetermined voltage separation in response to the memory sense period.

The objects, features and advantages of the present invention include providing a method and/or architecture for (i) an easily scaled compensation to timing associated with a dummy sense amplifier and a dummy bit line pair to account for other bit line pairs having to transition from a maximum opposite separation as a starting point in asynchronous memories, and/or (ii) reduce or eliminate a need to equilibrate the other bit line pairs prior to each read access operation.

BRIEF DESCRIPTION OF THE DRAWINGS

These and other objects, features and advantages of the present invention will be apparent from the following detailed description and the appended claims and drawings in which:

FIGS. 2A–2G is a set of waveforms for signals of the circuit of FIG. 1;

FIG. 3 is a diagram of a portion of a first alternative embodiment of the present invention;

FIG. 4 is a diagram of a portion of a second alternative embodiment of the present invention; and FIG. 5 is a diagram of a portion of a third alternative embodiment of the present invention.

DETAILED DESCRIPTION OF THE PREFERRED EMBODIMENT

Figure 1:
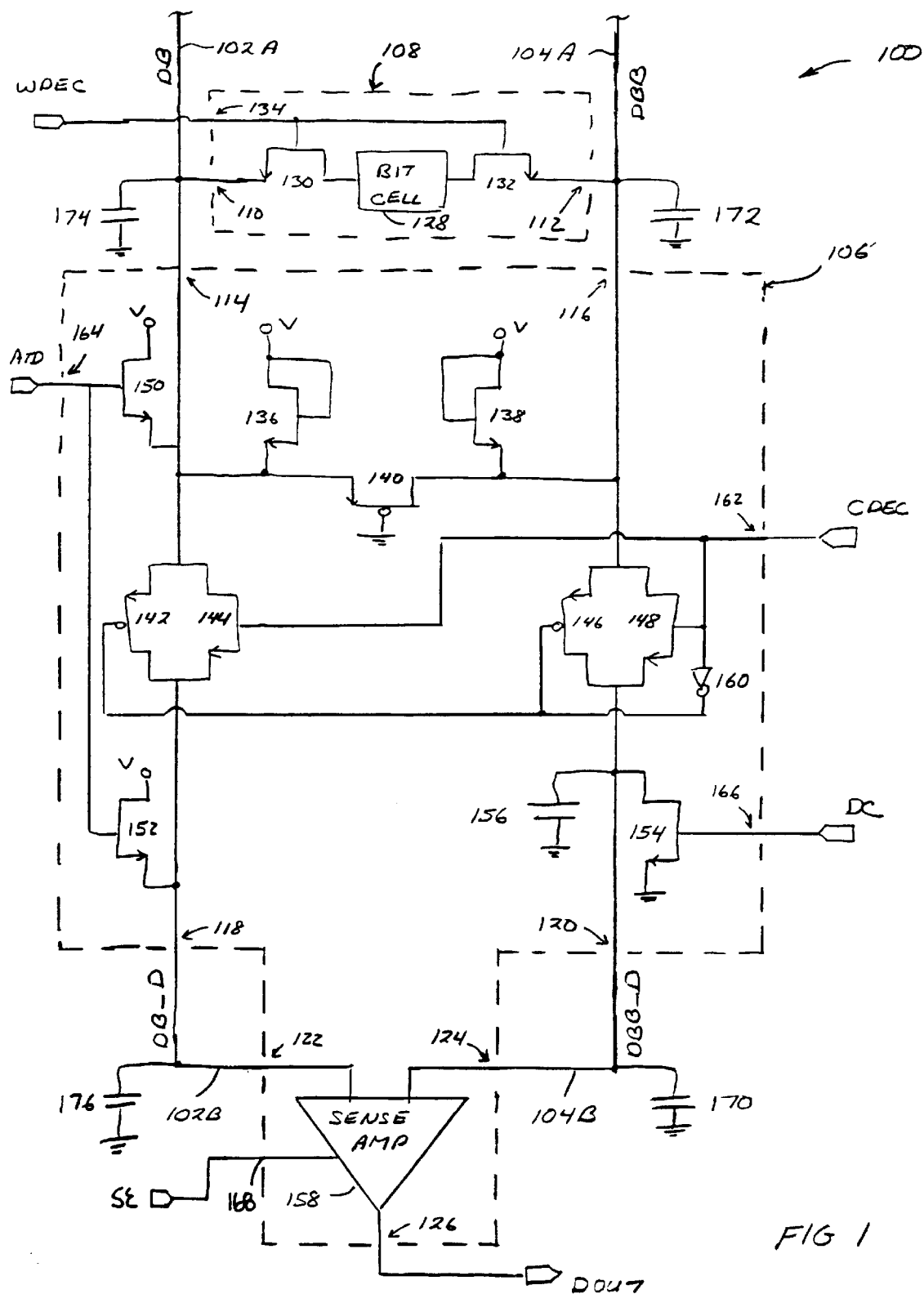
FIG. 1 is a diagram of a circuit in accordance with a preferred embodiment of the present invention.

Referring to FIG. 1, a diagram of a circuit 100 in a memory is shown in accordance with a preferred embodiment of the present invention. The circuit 100 may be implemented as part of an asynchronous memory. The circuit 100 may comprise a dummy bit line 102, a dummy complementary bit line 104, a read circuit 106, and at least one memory cell 108. The dummy bit line 102 may comprise a dummy bit line first portion 102A and a dummy bit line second portion 102B. Likewise, the dummy complementary bit line 104 may comprise a dummy complementary bit line first portion 104A and a dummy complementary bit line second portion 104B.

The memory cell 108 may present a signal (e.g., DB) on an output 110 to the dummy bit line first portion 102A. The signal DB may be implemented as a fixed data bit in the memory cell 108. The memory cell 108 may also present a complementary signal (e.g., DBB) on an output 112 to the dummy complementary bit line first portion 104A. The dummy bit line first portion 102A and the dummy complementary bit line first portion 104A generally present the signal DB and the signal DBB at inputs 114 and 116 respectively of the read circuit 106 for column decoding. The read circuit 106 may present a decoded signal (e.g., DB_D) on an output 118 to the dummy bit line second portion 102B. The read circuit 106 may also present a complementary decoded signal (e.g., DBB_D) on an output 120 to the dummy complementary bit line second portion 104B. The dummy bit line second portion 102B and the dummy complementary bit line second portion 104B may present the signal DB_D and the signal DBB_D at inputs 122 and 124 respectively of the read circuit 106 for sensing. The read circuit 106 may have an output 126 that may present a signal (e.g., DOUT). The signal DOUT may be implemented as a data-out signal that may also be used as a sense enable signal. The signal DOUT is generally used to indicate when a memory sense period of a read access operation is complete.

The memory cell 108 may comprise a bit cell 128 and a pair of select transistors 130 and 132. The memory cell 108 may have an input 134 that may receive a signal (e.g., WDEC). The signal WDEC may be implemented as a word decode signal used to connect and isolate the bit cell 128 from the dummy bit line first portion 102A and the dummy complementary bit line first portion 104A through the pair of select transistors 130 and 132 respectively. The bit cell 128 may be configured to present the fixed data bit. The fixed data bit generally causes a discharge of the dummy bit line 102 and a charge of the dummy complementary bit line 104.

The read circuit 106 may comprise a pair of pullup transistors 136 and 138, an equalization transistor 140, a first set of select transistors 142 and 144, a second set of select transistors 146 and 148, a pair of charge transistors 150 and 152, a discharge transistor 154, a capacitor 156, a sense amplifier 158, and an inverter 160. The read circuit 106 may have an input 164 that may receive a signal (e.g., ATD). The signal ATD may indicate that a new address has been received. The signal ATD may be implemented as an address transition detection signal.

The read circuit 106 may have an input 162 that may receive another signal (e.g., CDEC). The signal CDEC is generally used to connect and isolate the dummy bit line 102 and the dummy complementary bit line 104 from the sense amplifier 158. The signal CDEC may be implemented as a column decode signal.

The circuit 106 may have yet another input 166 that may receive another signal (e.g., DC). The signal DC is generally used to command the dummy complementary bit line 104 to be discharged. The signal DC may be implemented as a discharge signal.

The circuit 106 may have an input 168 that may receive a signal (e.g., SE). The signal SE may be implemented as a sense enable signal. The signal SE is generally used to enable and disable the sense amplifier 158.

The pair of pullup transistors 136 and 138 may be connected to the dummy bit line first portion 102A and the dummy complementary bit line first portion 104A respectively. The equalization transistor 140 may be connected between the dummy bit line first portion 102A and the dummy complementary bit line first portion 104A. The pullup transistors 136 and 138 and the equalization transistor 140 are generally biased to always be conducting.

The first set of select transistors 142 and 144 may be connected between the dummy bit line first portion 102A and the dummy bit line second portion 102B. The second set of select transistors 146 and 148 may be connected between the dummy complementary bit line first portion 104A and the dummy complementary bit line second portion 104B. Each set of select transistors 142–144 and 146–148 may have one n-channel transistor in parallel with one p-channel transistor. The n-channel transistors 144 and 148 may be controlled by the signal CDEC. The p-channel transistors 142 and 146 may be controlled by a complement to the signal CDEC that is generally presented by the inverter 160. When the signal CDEC is in an active state, then the four select transistors 142–148 may be in a conductive state causing the first portions 102A and 104A to couple to the second portions 102B and 104B respectively. When the signal CDEC is in an inactive state, then the four select transistors 142–148 may isolate the first portions 102A and 104A from the second portions 102B and 104B respectively.

The sense amplifier may be connected to the dummy bit line second portion 102B and the dummy complementary bit line second portion 104B. The sense amplifier may present the signal DOUT at the output 126 responsive to a voltage difference between the signal DB_D and the signal DBB_D. When the sense amplifier 158 detects that the voltage difference between the signal DB_D and the signal DBB_D is greater than a predetermined voltage separation of a predetermined polarity, then the sense amplifier 158 will present the signal DOUT in one state. When the sense amplifier 158 detects that the voltage difference between the signal DB_D and the signal DBB_D is equal to, less than, or opposite the predetermined polarity, then the signal DOUT will be presented in a second state. The predetermined voltage separation is generally approximately 10 percent of a supply voltage V. Other predetermined voltage separations may be used to meet design criteria of other implementations.

The sense amplifier 158 may receive the signal SE to control presentation of the signal DOUT. When the signal SE is in an enable state, then the sense amplifier 158 may present the signal DOUT in accordance with the signal DB_D and the signal DBB_D. When the signal SE is in a disabled state, then the sense amplifier 158 may hold the signal DOUT constant, regardless of the signal DB_D and the signal DBB_D.

The charge transistors 150 and 152 may be connected to the dummy bit line first portion 102A and the dummy bit line second portion 102B respectively. The charge transistors 150 and 152 may be controlled by the signal ATD. When the signal ATD is in an active state, then the charge transistors 150 and 152 may charge the dummy bit line 102. When the signal ATD is in an inactive state, then the charge transistors 150 and 152 may be non-conductive and thus not charge the dummy bit line 102.

The discharge transistor 154 may be connected to the dummy complementary bit line second portion 104B. The discharge transistor 154 may be controlled by the signal DC. When the signal DC is in an active state, then the discharge transistor 154 may discharge the dummy complementary bit line second portion 104B. When the signal DC is in an inactive state, then the discharge transistor 154 is generally non-conductive and thus not discharge the dummy complementary bit line second portion 104B.

The capacitor 156 may be connected to the dummy complementary bit line second portion 104B. The capacitor 156 may be implemented as another partial bit line, or as a dedicated capacitor. The purpose of the capacitor 156 is to control an initial voltage on the dummy complementary bit line 104 at the start of the memory sense period of the read access operation. The initial voltage may be determined by a ratio of capacitances. In particular, the dummy complementary bit line second portion 104B may have a total capacitance equal to the capacitor 156 plus a parasitic capacitance 170. The dummy complementary bit line first portion 104A may have a total capacitance equal to a parasitic capacitance 172. The dummy bit line portions 102A and 102B may also have parasitic capacitances 174 and 176 respectively.

Referring to FIGS. 2A–2G, waveforms of the signals used in the circuit 100 are shown during general operation. FIG. 2A shows a waveform for the signal ATD. A transition at approximately a time 178 of the signal ATD from the inactive state to the active state generally indicates a start of a new read access operation. A transition at approximately a time 180 of the signal ATD from the active state to the inactive state generally indicates a start of the memory sense period of the read access operation.

Referring to FIG. 2B, a waveform for the signal WDEC is shown. The signal WDEC may transition from the active state to the inactive state at approximately the time 178. The signal WDEC in the inactive state may cause the pair of select transistors 130 and 132 to isolate the bit cell 128 from the dummy bit line 102 and the dummy complementary bit line 104. At approximately the time 180, the signal WDEC may transition from the inactive state back to the active state to reconnect the bit cell 128 to the dummy bit line 102 and the dummy complementary bit line 104. Transitioning of the signal WDEC at the time 178 and the time 180 may be optional, depending upon a design criterial for a particular implementation. Isolating the bit cell 128 from the dummy bit line 102 may prevent the discharging induced by the bit cell 128 from conflicting with the charging induced by the charge transistors 150 and 152. If the charge transistor 150 in particular can overpower the discharging of the bit cell 128 fast enough, then isolation of the bit cell 128 from the dummy bit line 102 may not be required.

Referring to FIG. 2C, a waveform of the signal DC is shown. The signal DC may transition from the inactive state to the active state at approximately a time 182. The signal DC in the active state generally causes the discharge transistor 154 to discharge the dummy complementary bit line second portion 104B. At approximately a time 184, the signal DC may transition from the active state back to the inactive state. The time 184 generally should occur before or simultaneously with the time 180.

Referring to FIG. 2D, a waveform for the signal CDEC is shown. The signal CDEC may transition from the active state to the inactive state at approximately a time 186. The signal CDEC in the inactive state generally causes the four select transistors 142–148 to isolate the first portions 102A and 104A from the second portions 102B and 104B respectively. The time 186 generally occurs before or simultaneously with the time 182. The signal CDEC may transition from the inactive state to the active state at approximately the time 180.

Referring to FIG. 2E, a waveform for the signal DB and the signal DB_D is shown. The signal DB and the signal DB_D may represent voltages on the parasitic capacitance 174 of the dummy bit line first portion 102A and the parasitic capacitance 176 of the dummy bit line second portion 104B. Prior to the time 178, the bit cell 128 generally has the signal DB and the signal DB_D discharged to a voltage below a precharge level 188. Beginning at approximately time 178, the charge transistors 150 and 152 charge the parasitic capacitances 174 and 176 to the precharge level 188. At approximately time 180, the bit cell 128 resumes discharging the signal DB and the signal DB_D.

Referring to FIG. 2F and FIG. 2G, waveforms for the signal DBB and the signal DBB_D are shown. The signal DBB may represent a voltage on the parasitic capacitor 172 of the dummy complementary bit line first portion 104A. The signal DBB_D may represent a voltage on the capacitor 156 and the parasitic capacitance 170 of the dummy complementary bit line second portion 104B. Prior to the time 182, the bit cell 128 and the pullup transistor 138 generally maintain the signal DBB and the signal DBB_D at the precharge level 188. Beginning at approximately the time 182, the discharge transistor 154 may discharge the parasitic capacitance 170 and the capacitor 156. At approximately the time 180, the signal CDEC may transition to the active state thus causing the select transistors 146 and 148 to connect the dummy complementary bit line first portion 104A to the dummy complementary bit line second portion 104B. When the dummy complementary bit line first and second portions 104A and 104B are connected, the charges on the parasitic capacitance 170, the parasitic capacitance 172, and the capacitor 156 may be shared. The charge sharing causes the signal DBB and the signal DBB_D to equalize with each other at a predetermined voltage 190 at approximately a time 192.

Since the signal DBB_D may start below the precharge voltage 188 at the start of the memory sense period operation, a longer memory sense period duration is generally required for the signal DBB and the signal DBB_D to achieve the predetermined voltage separation. Furthermore, the capacitance 154 may increase the overall capacitive loading on the complementary bit line 104 thus slowing a rate at which the bit cell 128 and the pullup transistor 138 can raise the signal DBB and the signal DBB_D. The memory sense period after the time 180 to achieve the predetermined voltage separation is generally controllable by selection of a capacitance of the capacitor 154.

Extending the memory sense period by discharging the dummy complementary bit line second portion 104B has an advantage. The advantage may be an elimination of a precharge period and hardware required for all other bit lines of the memory. The memory sense period may be controlled to allow the other bit lines to start the memory sense period in any condition, including a worst case state. In particular, the other bit lines may start at the time 180 in one state before the memory sense period and transition to an opposite state during the memory sense period.

Referring to FIG. 3, a diagram of a portion of a first alternative embodiment of the present invention is shown. Here, the discharge transistor 154 and the capacitor 156 may be connected to the dummy complementary bit line first portion 104A. Another charge transistor 194 may be connected to the dummy complementary bit line second portion 104B. The charge transistor 194 may be controlled by the signal ATD. The first alternative embodiment may allow for a low predetermined voltage 190 because the discharged parasitic capacitance 172 plus the capacitor 156 are generally much larger than the precharged parasitic capacitance 170.

Referring to FIG. 4, a diagram of a portion of a second alternative embodiment of the present invention is shown. Here, the discharge transistor 154 may be connected to the dummy complementary bit line second portion 104B and the capacitor 156 may be connected to the dummy complementary bit line first portion 104A. The second alternative embodiment may allow for a high predetermined voltage 190 as most of the capacitance is generally precharged on the complementary bit line first portion 104A.

Referring to FIG. 5, a diagram of a portion of a third alternative embodiment of the present invention is shown. Here, the discharge transistor 154 may be connected to the dummy complementary bit line first portion 104A. The capacitor 156 and the charge transistor 194 may be connected to the dummy complementary bit line second portion 104B.

The various signals of the present invention are generally "active"(e.g., a digital HIGH, or 1) or "inactive" (e.g., a digital LOW, or 0). However, the particular polarities of the active (e.g., asserted, on, or enabled) and inactive (e.g., de-asserted, off, or disabled) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a bit line;
   a complementary bit line;
   a memory cell configured to (i) discharge said bit line in response to a memory sense period, and (ii) charge said complementary bit line in response to said memory sense period; and
   a read circuit configured to (i) precharge said bit line prior to said memory sense period, (ii) discharge said complementary bit line prior to said memory sense period, and (iii) detect when said bit line and said complementary bit line achieve a predetermined voltage separation in response to said memory sense period.

2. The circuit according to claim 1, wherein said read circuit is further configured to cause said complementary bit line to charge slower than said bit line discharges.

3. The circuit according to claim 1, wherein said read circuit is further configured to:
   isolate said complementary bit line into a first portion and a second portion prior to said memory sense period; and
   biasing said first portion toward a precharge level prior to said memory sense period, wherein said discharging of said complementary bit line is discharging the second portion of said two portions of said complementary bit line.

4. The circuit according to claim 3, wherein said read circuit is further configured to:
   connect said first and second portions of said complementary bit line in response to said memory sense period; and
   share charge between said first and second portions of said complementary bit line in response to said connecting to achieve a predetermined voltage on said complementary bit line.

5. The circuit according to claim 1, wherein said read circuit comprises:
   a charge transistor configured to precharge said bit line;
   a discharge transistor configured to discharge said complementary bit line; and
   a sense amplifier configured to sense when said bit line and said complementary bit line achieve said predetermined voltage separation.

6. The circuit according to claim 5, wherein said read circuit further comprises:
   a capacitor connected to said complementary bit line.

7. The circuit according to claim 5, wherein said read circuit further comprises:
   a select transistor configured to isolate said complementary bit line into a first portion and a second portion; and
   a second charge transistor configured to precharge said first portion of said complementary bit line, wherein said discharging of said complementary bit line is discharging said second portion of said complementary bit line.

8. The circuit according to claim 5, wherein said read circuit further comprises:
   a select transistor configured to isolate said complementary bit line into a first portion and a second portion; and
   a pullup configured to bias said first portion of said complementary bit line toward a precharge level, wherein said discharging of said complementary bit line is discharging said second portion of said complementary bit line.

9. The circuit according to claim 8 wherein said read circuit further comprises:
   a capacitor connected to said second portion of said complementary bit line;
   a second select transistor configured to isolate said bit line into a first portion and a second portion;
   a second pull-up configured to bias said first portion of said bit line toward a precharge level; and
   a second charge transistor configured to precharge said bit line.

10. The circuit according to claim 1, wherein said memory cell comprises:
    a bit cell configured to present a fixed data value; and
    a pair of second select transistors disposed between said bit line and said bit cell, and between said complementary bit line and said bit cell respectively.

11. The circuit according to claim 1, wherein said circuit is used in an asynchronous memory.

12. A method of reading a bit cell comprising the steps of:
    (A) precharging a bit line prior to a memory sense period;
    (B) discharging a complementary bit line prior to said memory sense period;
    (C) discharging said bit line in response to said memory sense period;
    (D) charging said complementary bit line in response to said memory sense period; and
    (E) detecting when said bit line and said complementary bit line achieve a predetermined voltage separation in response to said memory sense period.

13. The method according to claim 12, further comprising the step of:
    charging said complementary bit line in step (D) slower than discharging said bit line in step (C).

14. The method according to claim 12, further comprising the steps of:
    isolating said complementary bit line into two portions prior to said memory sense period; and
    biasing one portion of said two portions toward a precharge level in response to isolating said complementary bit line,
    wherein said discharging of said complementary bit line is discharging the other portion of said two portions of said complementary bit line.

15. The method according to claim 14, further comprising the steps of:
    connecting both of said two portions in response to said memory sense period; and
    sharing charge between said two portions in response to said connecting to achieve a predetermined voltage on said complementary bit line.

16. The method according to claim 15, further comprising the steps of:
    isolating a bit cell from said bit line and said complementary bit line prior to said memory sense period; and
    connecting said bit cell to said bit line and said complementary bit line in response to said memory sense period.

17. The method according to claim 15, further comprising the step of:
    isolating said bit line into two portions prior to said memory sense period, wherein precharging said bit line is precharging both of said two portions of said bit line.

18. A circuit comprising:

a bit line;

a complementary bit line;

means for precharging said bit line prior to a memory sense period;

means for discharging said complementary bit line prior to said memory sense period;

means for discharging said bit line in response to said memory sense period;

means for charging said complementary bit line in response to said memory sense period; and means for sensing when said bit line and said complementary bit line achieve a predetermined voltage separation in response to said memory sense period.

* * * * *